United States Patent [19]

Surridge et al.

[11] Patent Number: 4,998,154
[45] Date of Patent: Mar. 5, 1991

[54] MSM PHOTODETECTOR WITH SUPERLATTICE

[75] Inventors: Robert K. Surridge, Kanata; Jingming Xu, Etobicoke, both of Canada

[73] Assignee: Northern Telecom Limited, Montreal, Canada

[21] Appl. No.: 466,850

[22] Filed: Jan. 18, 1990

[51] Int. Cl.$^5$ .................. H01L 31/08; H01L 29/205
[52] U.S. Cl. ........................................ 357/30; 357/4; 357/16; 357/22
[58] Field of Search ...................... 357/30, 16, 4, 22

[56] References Cited

U.S. PATENT DOCUMENTS

| 4,194,935 | 3/1980 | Dingle et al. | 357/22 |
| 4,593,304 | 6/1986 | Slayman et al. | 357/30 |
| 4,673,959 | 6/1987 | Shiraki et al. | 357/22 |
| 4,706,103 | 11/1987 | Ranganath | 357/30 |

Primary Examiner—Jerome Jackson, Jr.
Attorney, Agent, or Firm—C. W. Junkin

[57] ABSTRACT

A Metal-Semiconductor-Metal (MSM) photodetector comprises a semiconductor substrate, a semiconductor barrier layer on the substrate, a thin semiconductor active layer on the barrier layer, and at least two electrical contacts to the active layer. The barrier layer prevents carriers generated deep in the substrate from reaching the contacts. As it is the delayed detection of these carriers which limits the useful operating speed or bandwidth of conventional MSM photodetectors, the MSM photodetector according to the invention is capable of higher speed operation than conventional MSM photodetectors.

1 Claim, 5 Drawing Sheets

MSM PHOTODETECTOR WITH SUPERLATTICE

FIELD OF THE INVENTION

This invention relates to Metal-Semiconductor-Metal (MSM) photodetectors and to methods for their manufacture.

BACKGROUND OF THE INVENTION

Conventional MSM photodetectors for operation at wavelengths shorter than 900 nm comprise a plurality of metal electrical contacts on a GaAs substrate. An electrical bias is applied between alternate contacts and the substrate is irradiated with an optical signal. The optical signal generates carriers in the substrate which are swept to the contacts by the applied bias where they are detected as a photocurrent.

Carriers which are generated in regions of the substrate which are near to the contacts are subjected to larger electric fields and have a shorter distance to travel to reach the contacts than do carriers which are generated deep in the substrate farther from the contacts. Thus, carriers generated near to the contacts will reach the contacts and be detected sooner than carriers generated deep in the substrate. Consequently a short, sharp pulse in the optical signal will produce a longer, less sharp pulse in the photocurrent. This effect limits the useful operating speed or bandwidth of conventional MSM photodetectors for operation at wavelengths shorter than 900 nm.

SUMMARY OF THE INVENTION

This invention provides a novel MSM photodetector which is capable of higher speed operation than conventional MSM photodetectors at wavelengths shorter than 900 nm.

One aspect of the invention provides a photodetector comprising a semiconductor substrate, a semiconductor barrier layer on the substrate, a thin semiconductor active layer on the barrier layer, and at least two electrical contacts to the active layer.

The barrier layer prevents carriers generated deep in the substrate from reaching the contacts. As it is the delayed detection of these carriers which limits the useful operating speed or bandwidth of conventional MSM photodetectors, the MSM photodetector according to the invention is capable of higher speed operation than conventional MSM photodetectors.

The barrier layer may comprise a layer of a semiconductor having a wider bandgap than the semiconductor of the active layer and the semiconductor of the substrate. The bandgap of the semiconductor of the barrier layer should be wide enough to inhibit or eliminate carrier generation in the barrier layer. The barrier layer should be sufficiently thick to prevent carriers from tunneling from the substrate through the barrier layer to the active layer, and the conduction and valence band discontinuities at an interface between the substrate and the barrier layer should be large enough to inhibit thermionic emission of carriers from the substrate into the active layer.

As the carriers generated in the substrate are electron-hole pairs, the net charge in the substrate is nearly zero. Consequently, electric fields resulting from carriers trapped in the substrate are too small to have a significant effect on the motion of carriers in the active layer.

There may be some local polarization of the electrons and holes generated in the substrate due to the bias, but the absence of electrical contact to the substrate implies that these carriers will recombine. As such recombination could be radiative, it could cause an optical "echo" which may be detected in the active layer and superimposed on the detected photocurrent. Advantageously, the substrate and the active layer may comprise layers of semiconductors having different bandgaps to minimize this effect. Alternatively, a plurality of spaced barrier layers defining an optically reflective superlattice may be provided adjacent the active layer to inhibit penetration of the optical signal into the substrate and to inhibit penetration of any carriers generated in the substrate from entering the active layer.

Another aspect of the invention provides a method for making a photodetector. This method comprises forming a semiconductor barrier layer on a semiconductor substrate, forming a thin semiconductor active layer on the barrier layer, and forming at least two electrical contacts on the active layer.

In the method according to the invention, the barrier layer may be formed of a semiconductor having a wider bandgap than the semiconductor of the active layer and the semiconductor of the substrate. The active layer may be formed of a semiconductor having a bandgap which differs from the bandgap of the semiconductor of the substrate. The barrier layer may be formed at least 10 nm thick, and the active layer may be formed less than 2 microns thick. A plurality of spaced barrier layers defining an optically reflective superlattice may be formed, and the active layer may be formed on that plurality of layers.

BRIEF DESCRIPTION OF THE DRAWINGS

Embodiments of the invention are described below by way of example only. Reference is made to accompanying drawings, in which.

The drawings are not to scale.

DESCRIPTION OF EMBODIMENTS

Figure 1:
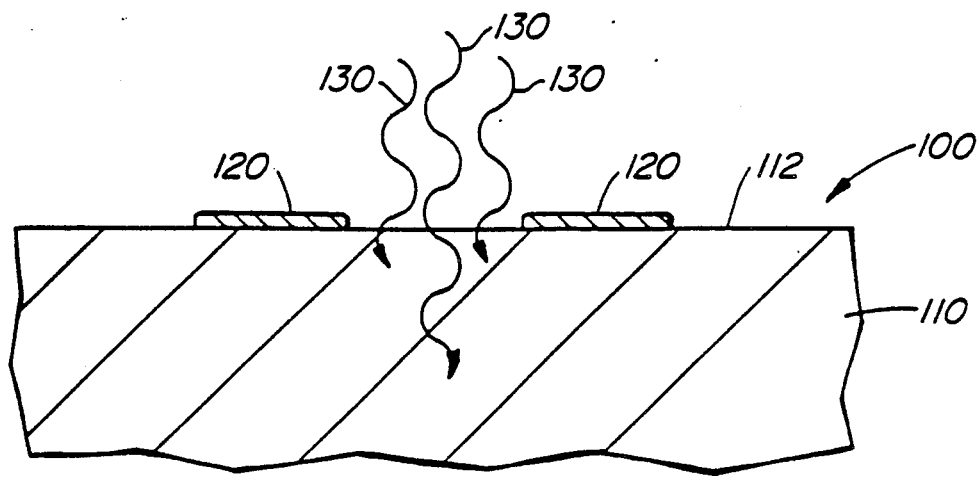
FIG. 1 is a cross-sectional view of a conventional MSM photodetector.

As shown in FIG. 1, a conventional MSM photodetector 100 comprises ten Ti/Au contacts 120 on an undoped GaAs substrate 110. The contacts 120 are grouped into two sets of interleaved fingers. Only two of the ten contacts 120 are shown in FIG. 1.

Figure 2:
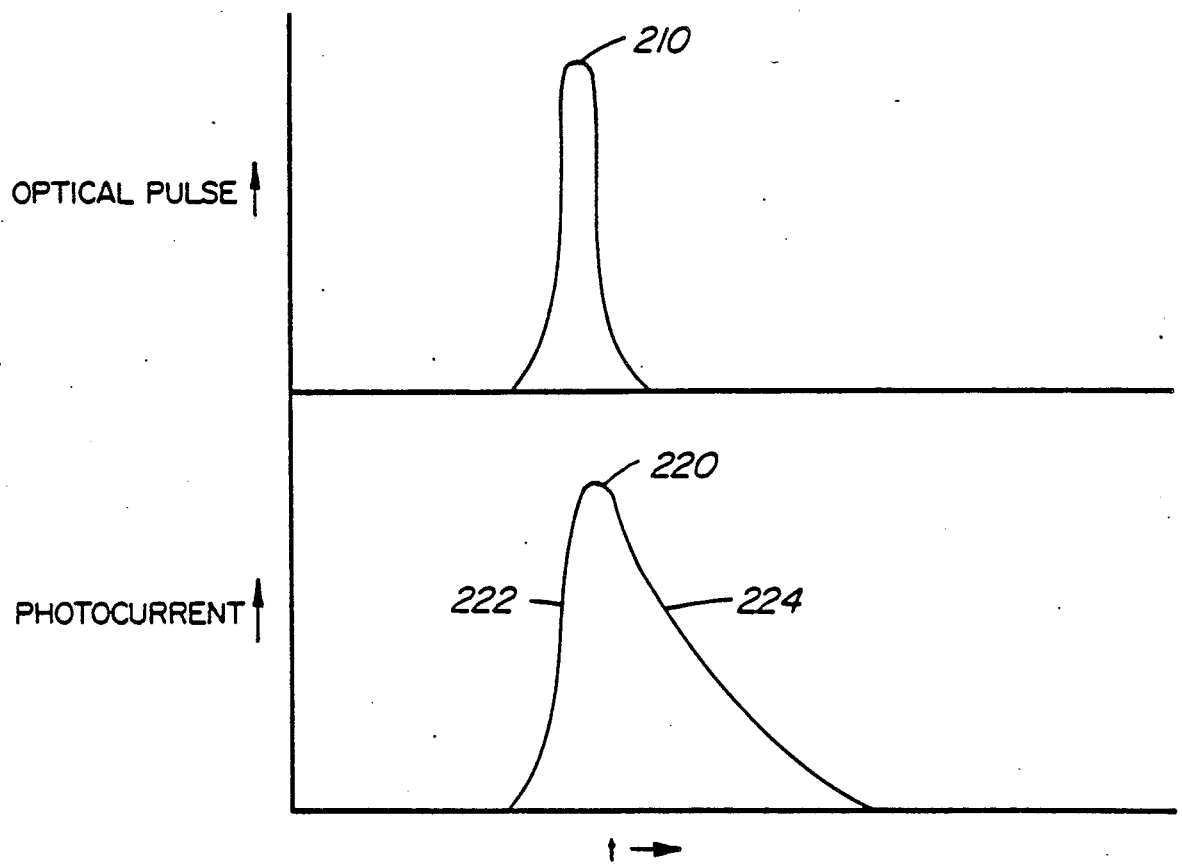
FIG. 2 is a plot illustrating a typical photocurrent pulse developed by the conventional MSM photodetector of FIG. 1 in response to an optical pulse.

In operation of the photodetector 100, an electrical bias of 1 to 10 volts is applied between the contacts 120, and the substrate 110 is irradiated with an optical signal. The photons 130 which comprise the optical signal are absorbed in the substrate 110, generating electrons and holes which are swept to respective contacts 120 by the applied bias. Some of the photons 130 are absorbed relatively near to an upper surface 112 of the substrate 110 where the electric field due to the bias is relatively large, and the distance to the contacts 120 is relatively small. The carriers generated by these photons reach the contacts 120 relatively early and form the leading edge 222 of a photocurrent pulse 220 generated in response to an optical pulse 210 (see FIG. 2). Others of the photons 130 are absorbed relatively farther from the upper surface 112 where the electric field due to the bias is weaker, and the distance to the contacts 120 is relatively longer. The carriers generated by these photons reach the contacts 120 relatively later and form the trailing edge 224 of the photocurrent pulse 220. Thus, the distribution of photon absorption in the substrate 110 limits the speed of the conventional MSM photodetector 100.

Figure 3:
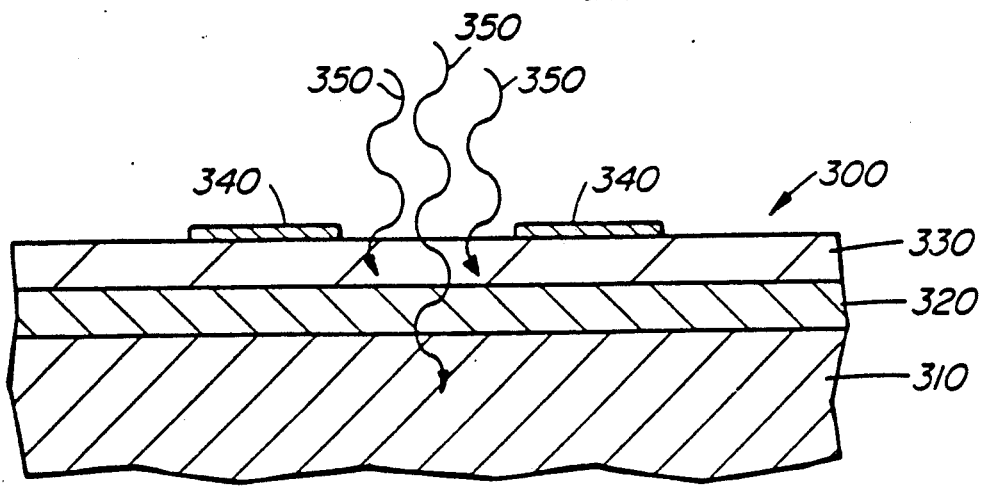
FIG. 3 is a cross-sectional view of a photodetector according to a first embodiment of the invention.

As shown in FIG. 3, a photodetector 300 according to a first embodiment of the invention comprises an undoped GaAs substrate 310, an undoped $Al_{0.3}Ga_{0.7}As$ barrier layer 320 approximately 0.1 micron thick on the substrate 310, and an undoped GaAs active layer 330 approximately 1 micron thick on the barrier layer 320. The photodetector 300 further comprises ten laterally spaced Ti/Au electrical contacts 340 on the active layer 330. The electrical contacts 340 are spaced approximately 1 micron apart and are grouped into two sets of interleaved fingers. Only two of the ten contacts 340 are shown in FIG. 3.

Figure 4:
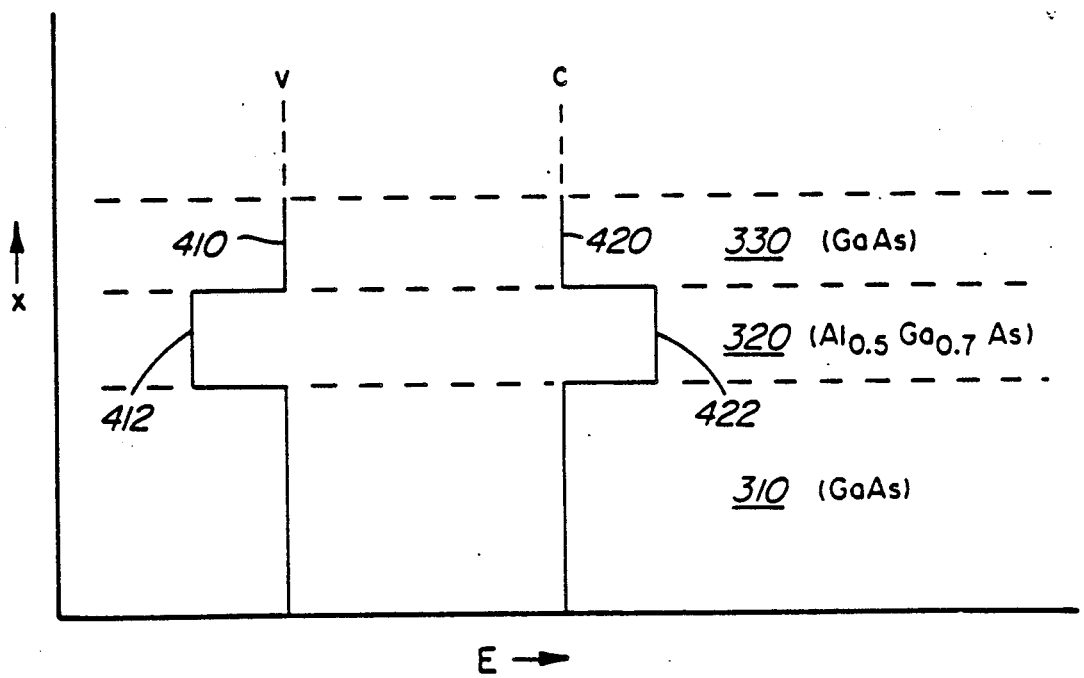
FIG. 4 is an energy diagram showing the energy band structure for the photodetector of FIG. 3.

FIG. 4 illustrates the energy band structure for the photodetector 300. The AlGaAs barrier layer 320 has a wider bandgap than the GaAs substrate 310 and the GaAs active layer 330, so the barrier layer 320 provides potential barriers 412, 422 in the valence and conduction bands 410, 420 which inhibit migration of holes and electrons from the substrate 310 to the active layer 330.

Figure 5:
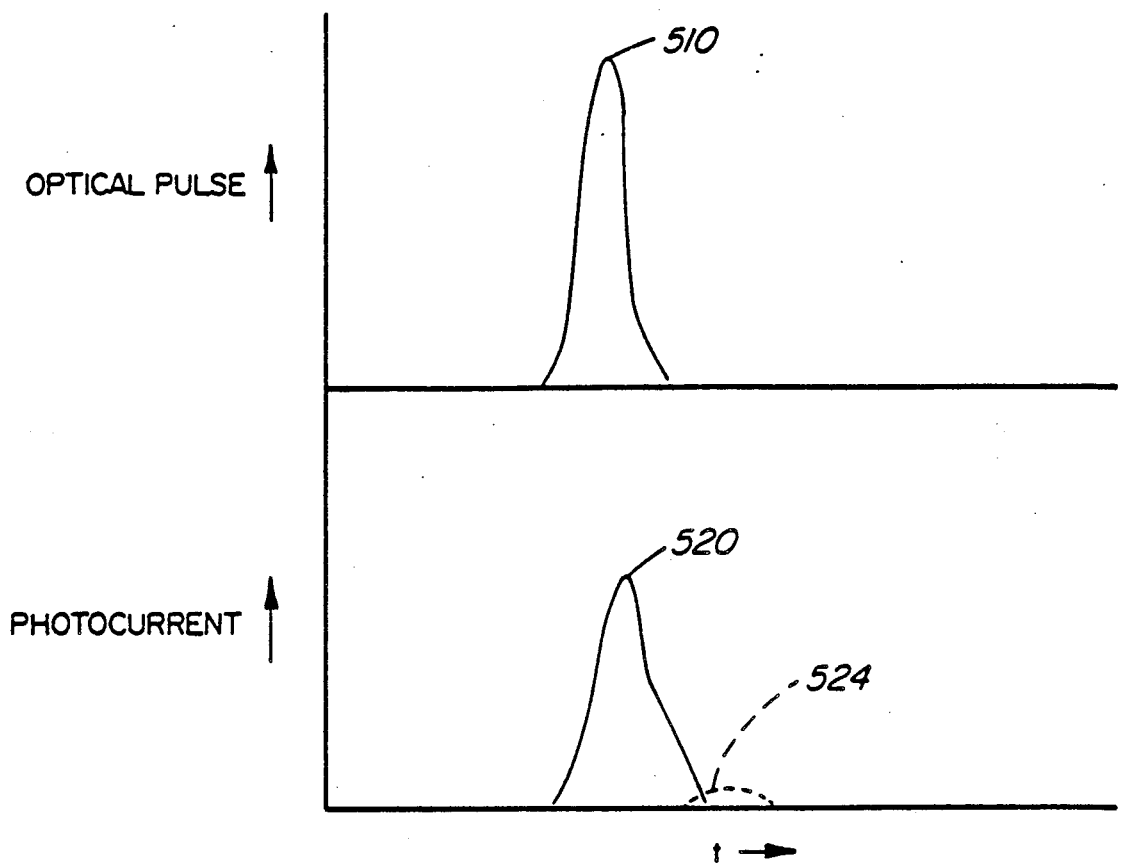
FIG. 5 is a plot illustrating a typical photocurrent pulse developed by the photodetector of FIG. 3 in response to an optical pulse.

In operation of the photodetector 300, an electrical bias of approximately 5 volts is applied between the contacts 340, and the photodetector 300 is irradiated with an optical signal. Some of the photons 350 which comprise the optical signal are absorbed in the thin active layer 330. These photons 350 are absorbed relatively near to the contacts 340 where the electric field due to the bias is relatively large, and the distance to the contacts 340 is relatively small. The carriers generated by these photons reach the contacts 340 relatively early and form a relatively sharp photocurrent pulse 520 generated in response to an optical pulse 510 (see FIG. 5). Others of the photons 350 are absorbed in the substrate 310 where the electric field due to the bias is weaker, and the distance to the contacts 340 is relatively longer. However, the carriers generated by these photons cannot penetrate the potential barriers 412, 422 set up by the barrier layer 320 to reach the contacts 340, and therefore do not contribute to the photocurrent pulse 420. Essentially no carriers are generated in the barrier layer 320 because the photons 350 have insufficient energy to generate carriers in the wide bandgap semiconductor material of the barrier layer 320. Consequently, the photocurrent pulse 420 generated by the photodetector 300 is shorter and sharper than the photocurrent pulse 220 generated by the conventional MSM photodetector 100.

As the carriers generated in the substrate 310 are electron-hole pairs, the net charge in the substrate 310 is nearly zero. Consequently, electric fields resulting from carriers trapped in the substrate are too small to have a significant effect on the motion of carriers in the active layer. There may be some local polarization of the electrons and holes generated in the substrate 310 due to the bias, but the absence of electrical contact to the substrate 310 implies that these carriers will recombine in the substrate 310. Such recombination could generate photons which may be detected in the active layer 330 and superimposed as a time-delayed "echo" 524 on the detected photocurrent 520.

This effect can be reduced somewhat by making the active layer of a semiconductor which has a bandgap different from the bandgap of the substrate. If the bandgap of the active layer is made greater than the bandgap of the substrate, photons generated by carrier recombination in the substrate will have insufficient energy to generate photocurrent in the active layer. Of course, the bandgap of the active layer can only be made greater than the bandgap of the substrate if the greater bandgap provides adequate photocurrent generation at the operating wavelength of the detector. This may not be possible at some operating wavelengths. Alternatively, if the bandgap of the substrate can be made greater than the bandgap of the active layer, photocurrent generation in the substrate at the operating wavelength and resulting radiative recombination can be reduced or eliminated. Unfortunately, the selection of commercially available substrate materials is limited, and the selected substrate material must be crystallographically compatible with the active layer material which is suitable for the desired operating wavelength. Compatible combinations of active layer materials and wider bandgap substrate materials may not be available for some operating wavelengths of interest.

The photodetector 300 is manufactured by successive epitaxial growth of the barrier layer 320 and active layer 330 on the substrate 310 by Molecular Beam Epitaxy (MBE), MetalOrganic Chemical Vapour Deposition (MOCVD), Liquid Phase Epitaxy (LPE) or any other suitable growth technique, followed by vacuum evaporation and photolithographic definition of the contacts 340 on the active layer 330.

Figure 6:
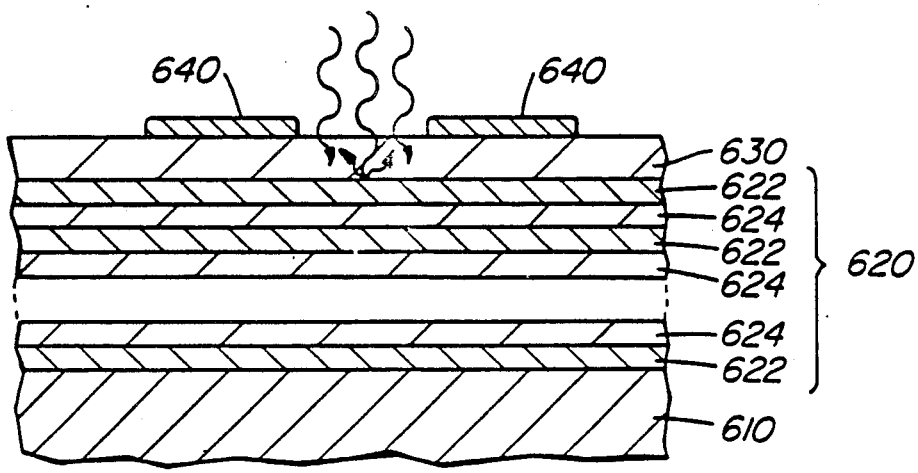
FIG. 6 is a cross-sectional view of a photodetector according to a second embodiment of the invention.

As shown in FIG. 6, a photodetector 600 according to a second embodiment comprises an undoped GaAs substrate 610, a barrier layer 620 comprising ten undoped $Al_{0.4}Ga_{0.6}As$ sublayers 622 approximately 60 nm thick on the substrate 610 interleaved with nine undoped GaAs sublayers 624 which are approximately 60 nm thick, and an undoped GaAs active layer 630 approximately 1 micron thick on the barrier layer 620. The photodetector 600 further comprises ten laterally spaced Ti/Au electrical contacts 640 on the active layer 630. The electrical contacts 640 are spaced approximately 1 micron apart and are grouped into two sets of interleaved fingers. Only two of the ten contacts 640 are shown in FIG. 6.

Figure 7:
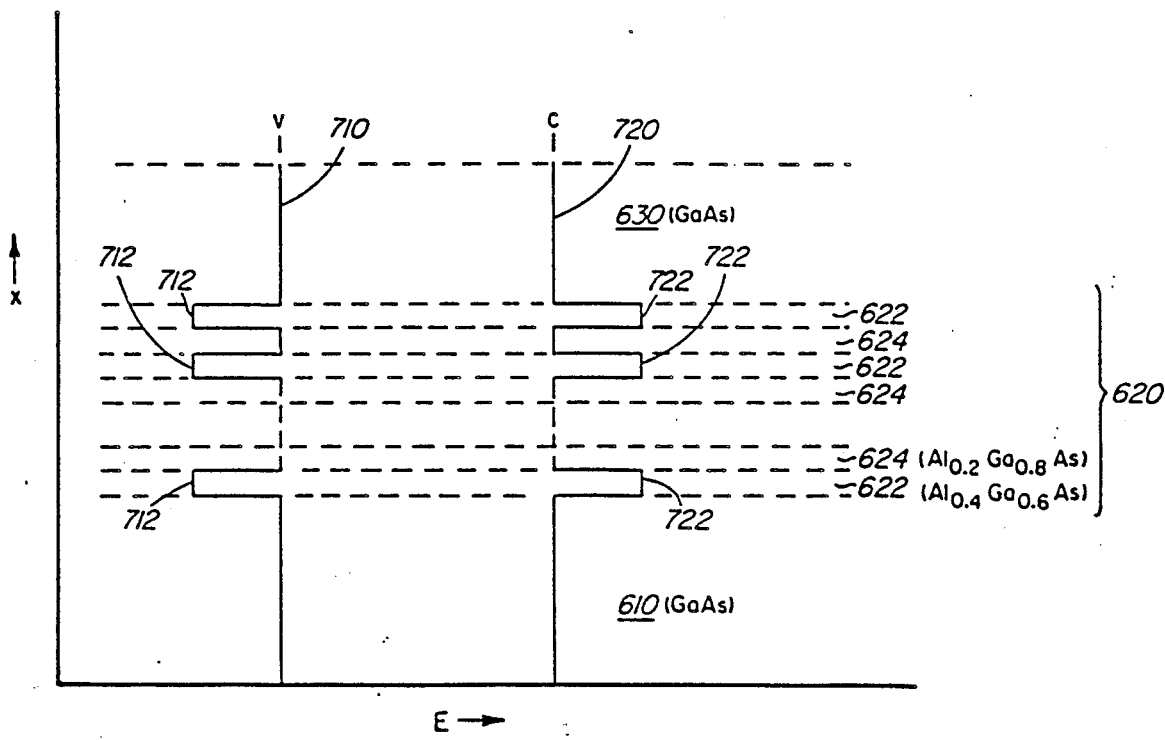
FIG. 7 is an energy diagram showing the energy band structure for the photodetector of FIG. 6.
Figure 8:
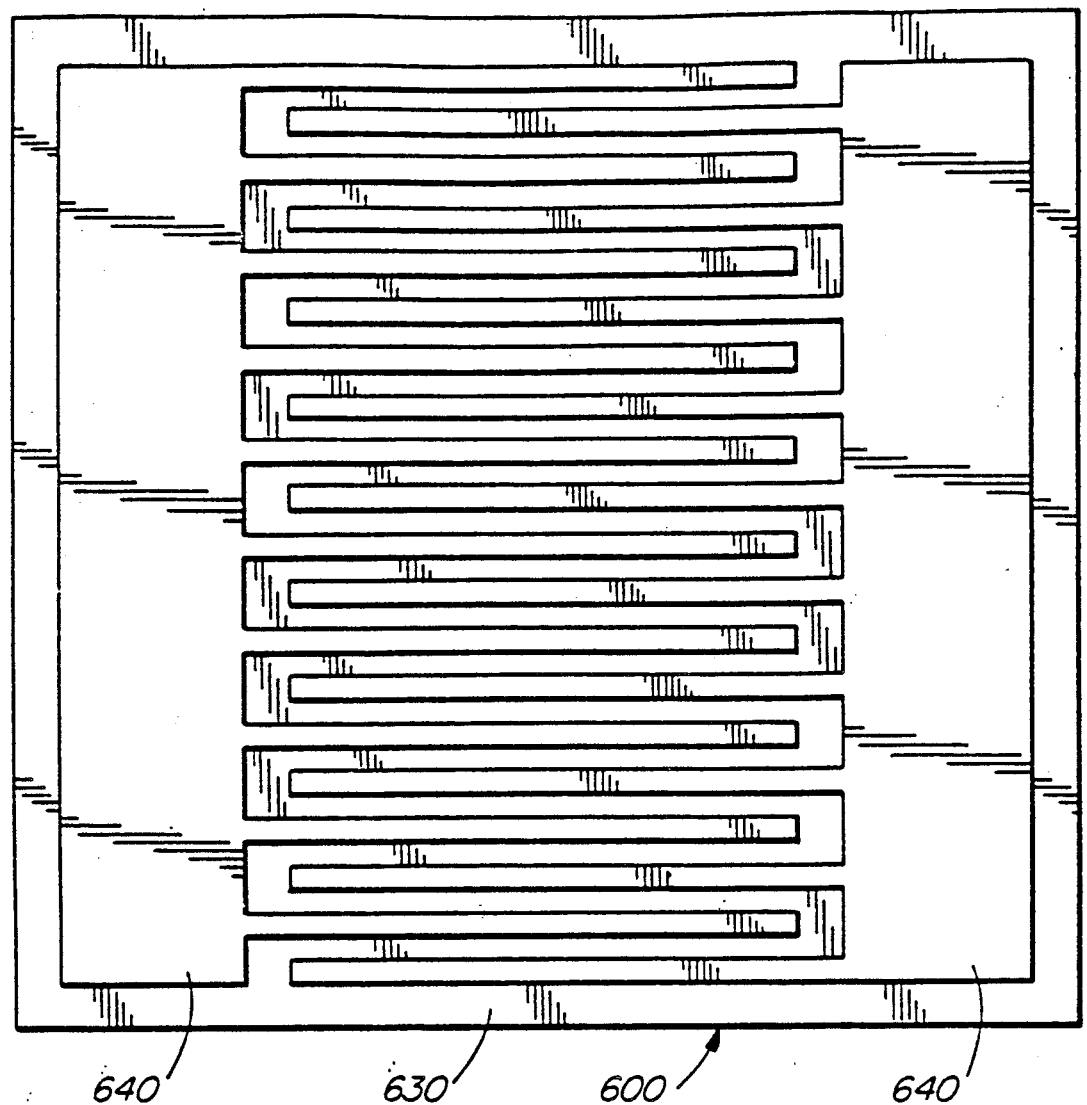
FIG. 8 is a plan view of the photodetector of FIG. 6.

FIG. 7 illustrates the energy band structure for the photodetector 600. The AlGaAs sublayers 622 have a wider bandgap than the GaAs substrate 610, active layer 630 and sublayers 624, so the barrier layer 620 provides potential barriers 712, 722 in the valence and conduction bands 710, 720 which inhibit migration of holes and electrons from the substrate 610 to the active layer 630. The AlGaAs sublayers 622 also have a smaller refractive index than the GaAs sublayers 624, and the optical thickness of the sublayers 622, 624 is approximately ¼ wavelength so the barrier layer 620 acts as an optically reflective superlattice.

In operation of the photodetector 600, an electrical bias of approximately 5 volts is applied between the contacts 640, and the photodetector 600 is irradiated with an optical signal. Some of the photons 650 which comprise the optical signal are absorbed in the thin active layer 630. These photons 650 are absorbed relatively near to the contacts 640 where the electric field due to the bias is relatively large, and the distance to the contacts 640 is relatively small. The carriers generated by these photons reach the contacts 640 relatively early and form a relatively sharp photocurrent pulse generated in response to an optical pulse. Most of the photons 650 which are not absorbed in the active layer 630 are reflected back into the active layer 630 by the barrier layer 620 operating as an optically reflective superlattice. Consequently, the photocurrent pulse generated by the photodetector 600 is shorter and sharper than the photocurrent pulse generated by the conventional MSM photodetector 100. Photons 650 are not absorbed in the AlGaAs sublayers 622 due to the wider bandgap of these layers. Carriers due to any photons which are absorbed in the GaAs sublayers 624 or GaAs substrate 610 are inhibited from entering the active layer 630 by the barrier layer 620.

The photodetector 600 is manufactured using standard processing techniques as described above for the photodetector 300.

In the photodetector 300, the barrier layer 320 should be thick enough to inhibit carriers from tunneling from the substrate 310 through the barrier layer 320 to the active layer 330. Generally, the barrier layer 320 must be at least 10 nm thick, and in most cases a considerably thicker barrier layer is desirable. In the photodetector 600 the wide bandgap semiconductor sublayers 622 should be thick enough to prevent carriers from undergoing tunneling from the substrate 610 through the barrier layer 620 to the active layer 630. This may be the case when the thicknesses of the sublayers 622, 624 are selected so that the barrier layer 620 operates optically as a superlattice reflector. Otherwise, a thicker layer of wide bandgap semiconductor can be incorporated in the barrier layer 620, on either side of the layers 622, 624 which define the optically reflective superlattice. The barrier layers 320, 620 should introduce a valence band discontinuity of at least 0.05 eV (and preferably more) at the interface between the substrate 310, 610 and the barrier layer 320, 620, and a conduction band discontinuity of at least 0.05 eV (and preferably more) at the interface between the substrate 310, 610 and the barrier layer 320, 620 to inhibit thermionic emission of carriers from the substrate 310, 610 into the active layer 330, 630.

In designing the photodetectors 300, 600, responsivity and maximum operating speed or bandwidth can be adjusted by varying the thickness and composition of the active layer 330, 630. An active layer which is thinner than the "absorption length" of the semiconductor making up active layer at the operating wavelength is preferred for high speed operation at the operating wavelength. The absorption length "L" of a semiconductor at a particular wavelength is the length over which approximately 63% of photons of that wavelength are absorbed in that semiconductor.

Other semiconductor materials may be used for the substrate 310, 610, barrier layer 320 or sublayers 622, 624 and active layer 330, 630. For example, the substrate 310, 610 could be GaAs or InP, the barrier layer 320 could be GaAsP, AlGaAs or InGaAsP, and the active layer 330, 630 could be InGaAs, GaAsP, AlGaAs or InGaAsP. Preferably the bandgap of the barrier layer 320 should exceed the bandgap of the active layer by at least 0.1 eV.

These and other variations are within the scope of the invention as defined by the claims which follow.

We claim:
1. A photodetector, comprising:
a semiconductor substrate,
a semiconductor barrier layer on the substrate, the barrier layer comprising a first plurality of sublayers of a semiconductor having a first index of refraction and a wider bandgap than the semiconductor substrate interleaved with a second plurality of sublayers of a semiconductor having a second refractive index different from the first refractive index to define an optically reflective superlattice;
an active semiconductor layer on the barrier layer, the active layer having a narrower bandgap than the first plurality of sublayers; and
a pair of interdigitated electrical contacts on the active layer.

* * * * *